United States Patent [19]

Lamb

[11] Patent Number: 4,808,936
[45] Date of Patent: Feb. 28, 1989

[54] CONTINUOUSLY VARIABLE CLOCK DELAY CIRCUIT

[75] Inventor: James S. Lamb, Portland, Oreg.

[73] Assignee: Tektronix, Inc., Beaverton, Oreg.

[21] Appl. No.: 172,875

[22] Filed: Mar. 25, 1988

[51] Int. Cl.⁴ .................. H03K 15/135; H03K 17/26; G06G 7/20

[52] U.S. Cl. ..................... 328/155; 328/55; 328/160; 328/63; 307/262; 307/529; 307/490; 307/269

[58] Field of Search ............... 328/155, 159, 160, 15, 328/20, 21, 55, 166, 63; 307/219.1, 262, 269, 328, 512, 513, 529, 490; 323/213, 212

[56] References Cited

U.S. PATENT DOCUMENTS 3,475,626 10/1969 Holzman et al. ............... 328/55
3,675,137 7/1972 Raphael ........................... 328/155
4,039,930 8/1977 Lukas ............................... 328/155
4,041,533 8/1977 Yamamoto et al. .............. 328/155

Primary Examiner—Stanley D. Miller
Assistant Examiner—Nancy Thai
Attorney, Agent, or Firm—William O. Geny; Peter J. Meza

[57] ABSTRACT

A clock-delay circuit for a sinusoidal clock output includes a pair of current amplifiers, each connected to the clock output, wherein one of the amplifiers generates an amplified signal in phase with the clock output and the other generates a signal shifted in phase by 90°. Both signals are multiplied by control signals to alter their respective amplitudes prior to summation of both multiplier outputs. The sum of the multiplier outputs will be a sinusoidal waveform whose phase depends upon the control currents in the multipliers which are set by the user. Thus, the circuit provides a user-controlled continuously variable delay for a sinusoidal clock.

6 Claims, 4 Drawing Sheets

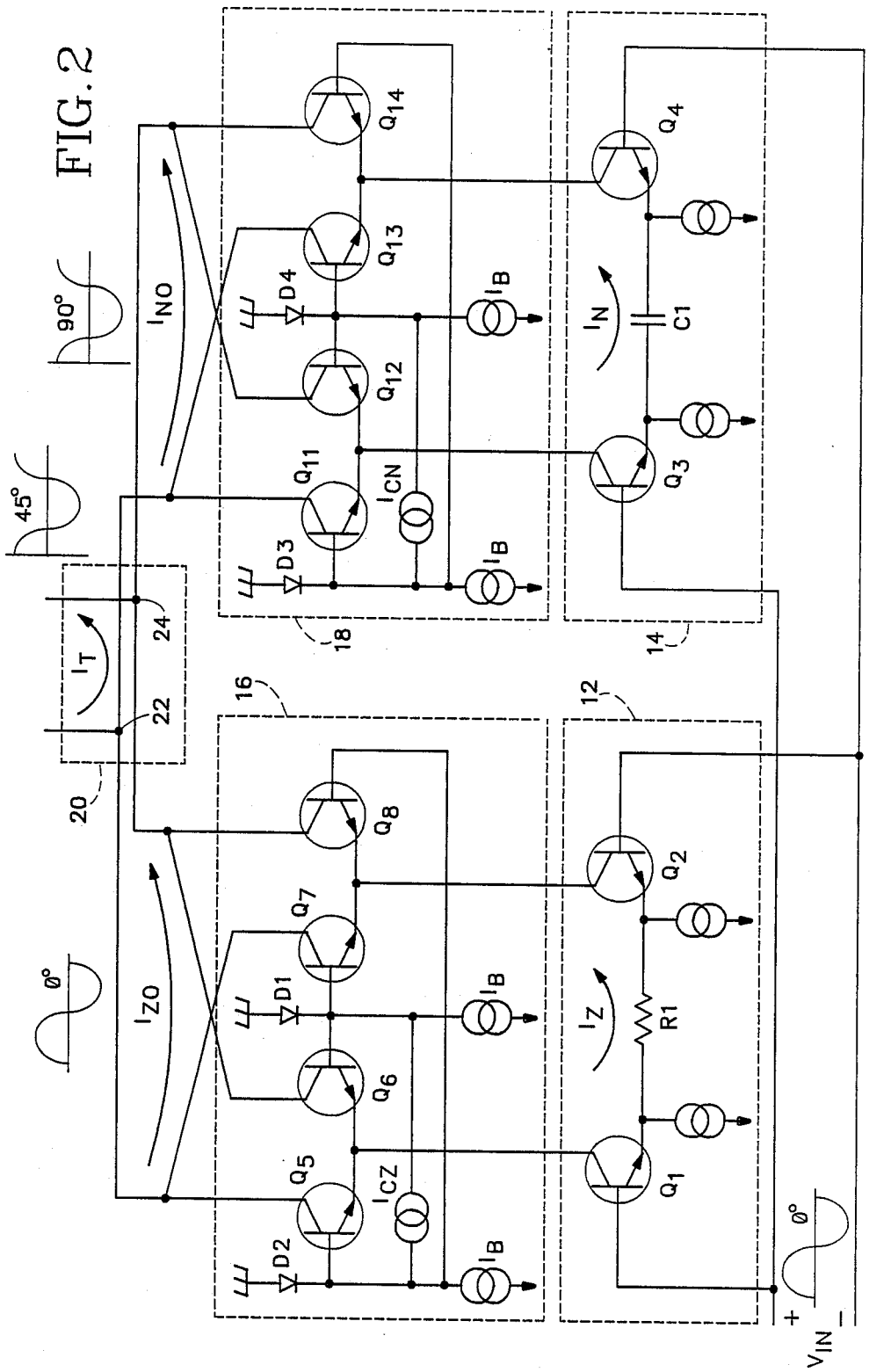

CONTINUOUSLY VARIABLE CLOCK DELAY CIRCUIT

BACKGROUND OF THE INVENTION

This invention relates to a delay circuit for a sinusoidal clock input which is continuously variable in order to provide a clock signal which is shifted in phase relative to the clock input.

Many test instruments such as oscilloscopes derive all timing information from a master clock. An example of an extremely stable master clock, which is frequently used for such applications, is a surface acoustic wave (SAW) oscillator. Such oscillators are capable of generating a sine wave at a high frequency. Five hundred MHz is a typical frequency for applications of this type.

It may happen, however, that the test instrument may encounter an input having a frequency on the order of 500 MHz, or some frequency that is the same as the output of the SAW oscillator. In such cases, where the input is to be sampled and held, the input can become synchronized to the clock pulses generated from the SAW oscillator. It would, therefore, be advantageous to be able to dither the system clock slightly so that it could not become locked to, or be in synchronization with, the data input pulses.

Also, it may be desirable in some cases to increase the sampling rate of sample and hold circuits which receive data so as to be higher than the system clock rate. It is difficult, however, to advance or retard the phase of the system clock in a precise enough manner so as to exactly double (or quadruple) the sampling rate. Also, it is sometimes necessary in dual channel digitizers that two clocks be synchronized so that sampling may take place on the two channels simultaneously. This can be difficult if data arrives at each channel's digitizer at a different time because of unequal cable length or other factors causing unequal propagation delays. It would be advantageous in such a case if one channel's clock could be phase advanced or retarded so that sampling could occur simultaneously.

In the past it has been possible to generate delayed clock pulses from a sinusoidal input by using a comparator amplifier having an RC integrator network as an input. The RC network included a variable resistor which altered the slope of the input wave, and hence, the point at which the comparator switched from a high state to a low state. The effect of this circuit is that as the slope flattens out, the phase of the output pulses become retarded in time with respect to the input because the comparator is triggered at a later time during each cycle. However, in such circuits, the input waveform frequently includes jitter and high-frequency noise. This causes uncertainty as to the time that the rising and falling input waves encounter the threshold. The result is a nonuniform and/or noisy output.

It would thus be desirable to be able to delay a system clock to provide clock pulses of varying phase relationships with respect to the phase of the system clock without introducing noise or jitter where the phase adjustment could be continuously variable over the period of the clock pulses.

SUMMARY OF THE INVENTION

The present invention provides a clock delay circuit capable of providing a sinusoidal output from a sinusoidal clock waveform which is either advanced or retarded in phase with respect to the input, and which is continuously variable to meet the various needs of the user. A first amplifier which is connected to the clock input waveform generates a sine wave current in phase with the clock input. A second amplifier, also responsive to the clock input, generates a second sinusoidal current which is shifted in phase by 90°. Both amplifiers are connected to respective multipliers which include a control signal input which can be adjusted by the user. Each multiplier controls the amplitude and phase of its respective current input waves and these waves are mixed in a summer to produce a sinusoidal waveform which is shifted in phase relative to the original input.

In a second embodiment of the invention, a pair of differentially-connected amplifiers are coupled to the input clock for producing sinusoidal currents, one of which is in phase with the input clock and the other of which is phase-shifted by 180°. A second differentially-connected amplifier pair produces a sinusoidal current 90° out of phase with respect to the input clock. A multiplier alters the phase (either plus 90° or minus 90°) and the amplitude, and produces an output current which is converted to a voltage and summed with the voltage outputs of common base amplifiers which are connected to the respective outputs of the current amplifiers. Thus, signals of two different phases are available at summing resistors connected to the multiplier outputs. This provides the ability to interleave clock pulses among parallel-connected sample and hold circuits. This permits the sampling rate to be exactly doubled.

It is a primary object of this invention to provide a clock delay circuit for a sinusoidal clock output waveform to provide a very precise low-noise delay.

A further object of this invention is to provide a delay circuit for a sinusoidal clock output wave which delays the phase of the clock output wave without altering the slope of the sinusoidal wave.

A further object of this invention is to provide a clock delay circuit whose phase may be continuously varied over a range chosen by a user.

A still further object of this invention is to provide a low jitter clock delay circuit for a surface acoustic wave-type of clock oscillator.

Yet a further object of this invention is to provide a clock delay circuit for a sinusoidal output clock wave which can be used to double the sampling rate in an interleaved network of sample and hold circuits.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 2 is a detailed schematic diagram of the circuit of FIG. 1.

DETAILED DESCRIPTION OF THE INVENTION

Figure 1:
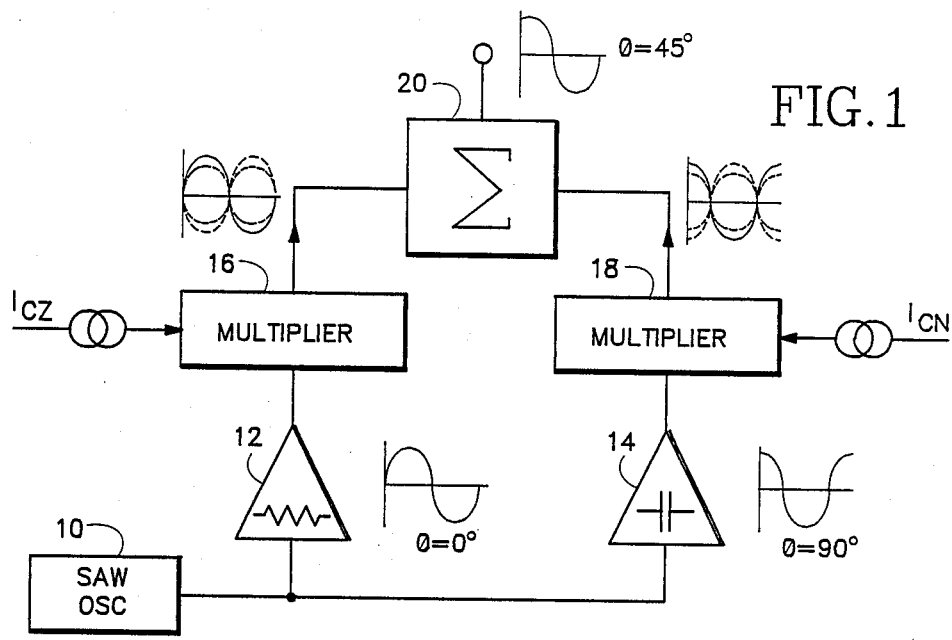
FIG. 1 is a block schematic diagram of a first embodiment of the present invention.

Referring to FIG. 1 which illustrates one embodiment of the present invention, a SAW oscillator 10 has an output illustrated in FIG. 1 as a sinusoidal waveform. This waveform is fed to two current amplifiers 12 and 14, respectively. Current amplifier 12 provides an output wave substantially in phase with the clock output wave while current amplifier 14 shifts the phase of the clock waveform by 90°. The outputs of amplifiers 12 and 14 are supplied to multipliers 16 and 18, respectively, which have as second inputs control currents $I_{CZ}$ and $I_{CN}$, respectively. The outputs of amplifiers 12 and 14 are altered in multipliers 16 and 18, respectively, by the control currents $I_{CZ}$ and $I_{CN}$ as shown in the waveform diagrams immediately above the multipliers in FIG. 1. The dashed lines represent examples of the various waveforms that may be produced at the outputs of multipliers 16 and 18, respectively, depending upon the magnitude of the respective control currents $I_{CZ}$ and $I_{CN}$. These outputs are combined in a summer 20 which produces a waveform output, an example of which is shown immediately above the summer block in FIG. 1. For purposes of illustration, it has been assumed that a phase shift of 45° in the output of the SAW oscillator 10 is desired. In such a case the control currents $I_{CZ}$ and $I_{CN}$ will be of the form illustrated in FIG. 2D. This will produce the waveforms having the solid lines in the illustrations above the multipliers which in turn will produce the waveform above summer 20 showing a 45° shift in the phase angle at the output of summer 20.

Figures 2A, 2B:
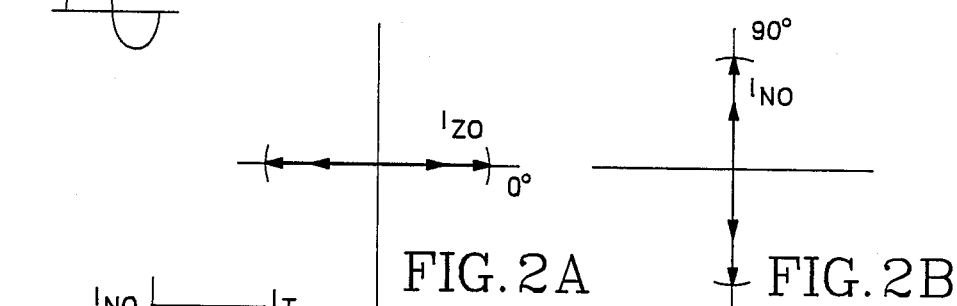
FIG. 2A is a phasor diagram showing the ranges of outputs of one of the multiplier circuits of FIG. 2.
FIG. 2B is a phasor diagram showing the ranges of outputs of the other multiplier circuit of FIG. 2.
Figure 2C:
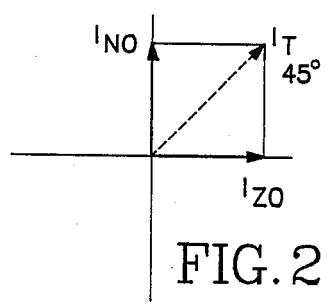
FIG. 2C is a phasor diagram showing how the outputs of the two multiplier circuits of FIGS. 2a and 2b combine to produce a phase-shifted output from a sinusoidal wave input.
Figure 2D:
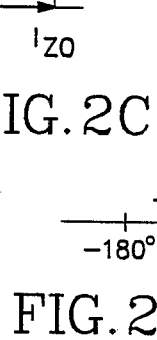
FIG. 2D is a waveform diagram illustrating the phase relationship between the control currents utilized in the circuit of FIG. 2.

A detailed schematic diagram is shown in FIG. 2. The output of SAW oscillator 10 is applied simultaneously to the differentially connected transistor pair Q1/Q2 in amplifier 12 and Q3/Q4 in amplifier 14. Transistors Q1 and Q2 have their emitters coupled by resistor R1 and Q3 and Q4 have their emitters coupled by a capacitor C1. The resistor R1 produces a current output at the collectors of Q1 and Q2 which is in phase with the input from SAW oscillator 10. The capacitor in C1, however, in the differential pair Q3/Q4 produces a current output which is shifted in phase by 90°. The collector of Q1 is connected to a common emitter node between transistor pair Q5 and Q6, and the collector of Q2 is connected in the same way to common emitter pair Q7 and Q8. A diode D1 connected to ground is coupled to the bases of Q6 and Q7, and a diode D2, also connected to ground, is coupled to the bases of Q5 and Q8. The bases of the above-mentioned transistors are connected to a steady-state current source $I_B$. A control current source $I_{CZ}$ is connected between D1 and D2, and when $I_{CZ}$ is large, it draws current away from the base regions of Q6 and Q7 and increases current in the base regions of Q5 and Q8. In this way the amplitude of the outputs of amplifier 12 is adjusted as shown in the phasor diagram in FIG. 2A. Multiplier 18 operates in substantially the same fashion in that its control current, $I_{CN}$, produces the range of output amplitudes shown in phasor diagram FIG. 2B. Output currents $I_{ZO}$ and $I_{NO}$ are summed at summing nodes 22 and 24 which comprise summer 20, as indicated by the dashed outline. The result is a current $I_T$ which is shown in the phasor diagram of FIG. 2C.

Depending upon the magnitude of control currents $I_{CZ}$ and $I_{CN}$, $I_T$ may be shifted in phase with respect to the voltage input from SAW oscillator 10 over a fairly wide range. One application of such a phase shift is to dither the phase of the output of SAW oscillator 10 so that current $I_T$ randomly varies between $+180°$ and $-180°$ with respect to the input. Thus, the control currents $I_{CZ}$ and $I_{CN}$ can be set to shift randomly to produce a randomly-shifted $I_T$. For example, if it were desired to shift the phase of a 500 MHz SAW oscillator output by plus or minus one nanosecond, control currents $I_{CZ}$ and $I_{CN}$ would be powered by a random number generator to shift between these maximum limits as shown in the phasor diagrams in FIGS. 2A and 2B. This would randomly advance and retard the current $I_T$ with respect to the output of the SAW oscillator 10. In this way the clock would be dithered to prevent it from locking to a data signal which may have a 500 megacycle component.

Figure 3:
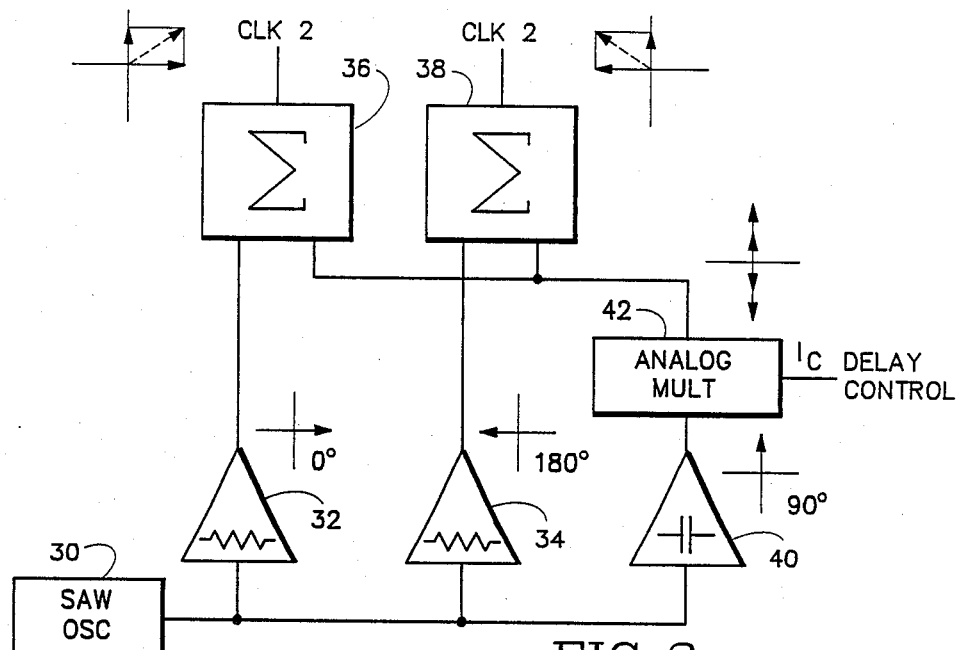
FIG. 3 is a block schematic diagram of a second embodiment of the invention.
Figure 3A:
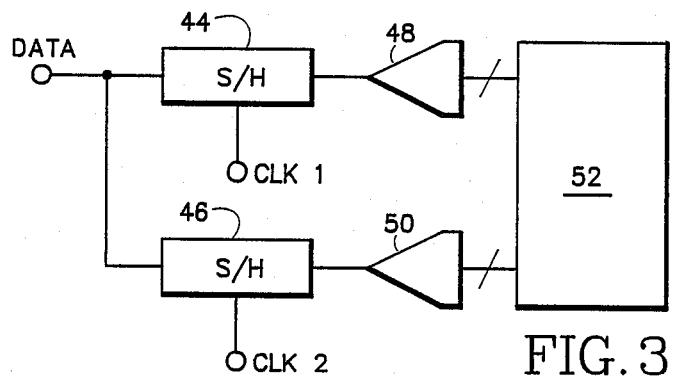
FIG. 3A is a block schematic diagram of an interleaved network of sample and hold circuits utilizing the clock outputs from the circuit of FIG. 3.
Figure 3B:
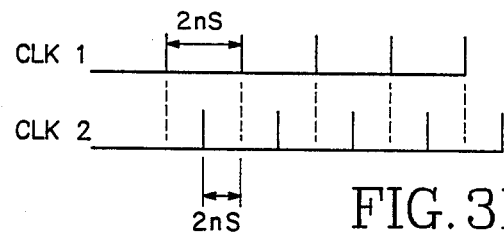
FIG. 3B is a graph illustrating the method of operation of the circuit of FIG. 3A.

A second embodiment of the invention is shown in FIG. 3. In FIG. 3 the output of SAW oscillator 30 is connected to amplifiers 32 and 34, respectively, which provide phase shifts of zero degrees and minus 180°, respectively, for the sinusoidal clock wave output of SAW oscillator 30. The output of amplifier 32 is connected to summer 36 and the output of amplifier 34 is connected to summer 38. The output of the SAW oscillator 30 is also connected to a phase-shifting amplifier 40 which provides an output wave shifted 90° with respect to its input. This output is coupled to analog multiplier 42 which has a delay control current input $I_C$ which varies the amplitude of the input from amplifier 40. The output of multiplier 42 is connected to summers 36 and 38, respectively. As a result, two outputs are provided, one which may be phase-advanced with respect to the input wave and the other which may be phase-retarded with respect to the input wave. An example of how this circuit may be used is shown in FIG. 3A. The data input line is connected to sample and hold circuits 44 and 46, respectively, which are, in turn, connected to analog-to-digital converters 48 and 50, respectively. The outputs of the analog-to-digital converters may be connected to a memory 52. As shown in FIG. 3B, by adjusting the delay control current $I_C$, the phase of clock pulses which may be generated in a pulse generator (not shown) in a conventional manner may be adjusted so that the pulses from clock 2 are interleaved among the pulses from clock 1 at exactly a 50% duty cycle. If the SAW oscillator 30 produces a 500 MHz output and thus has a period of two nanoseconds, clock pulses having a period of one nanosecond may be effectively produced by adjusting $I_C$ so that the phase difference is exactly one nanosecond. This effectively doubles the sampling rate.

Figure 4:
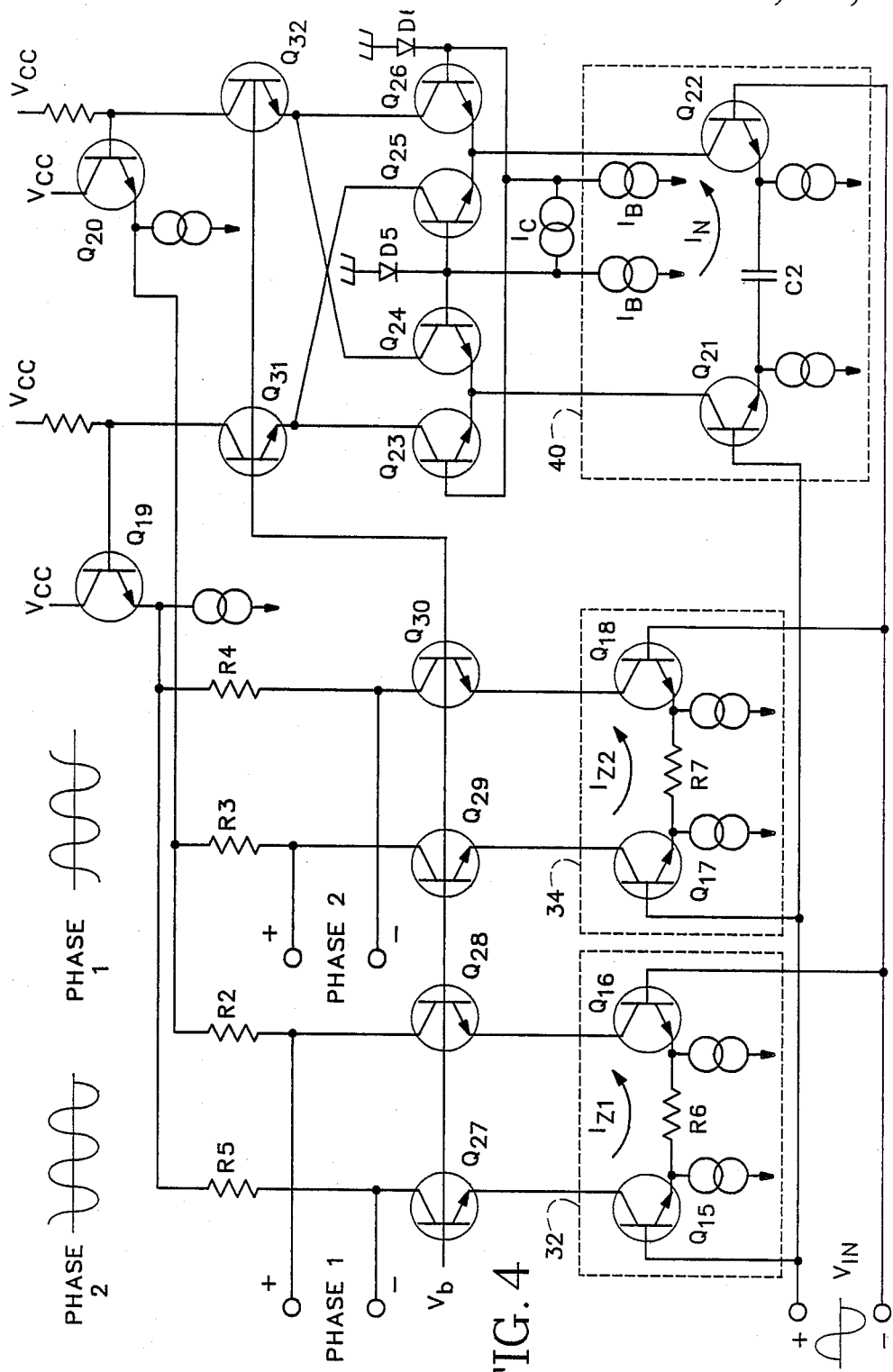
FIG. 4 is a detailed schematic diagram of the clock delay circuit of FIG. 3.

Referring now to FIG. 4, the output of the SAW oscillator is coupled to amplifiers 32, 34 and 40, respectively. Amplifier 32 is a differentially-connected transistor pair Q15 and Q16 whose emitters are coupled through R6. Amplifier 34 comprises Q17 and Q18 whose emitters are coupled by resistor R7. By connecting the output of amplifier 34 to resistors R3 and R4 oppositely from the way the output of amplifier 32 is connected to R5 and R2, the phase of amplifiers 32 and 34 may be fixed in accordance with the phasor diagrams shown in FIG. 3. Thus, the output of amplifier 32 is in phase with the output of the SAW oscillator and the output of amplifier 34 is retarded in phase by 180°. Amplifier 40 comprises transistors Q21 and Q22 whose emitters are coupled through capacitor C2 providing a 90° phase shift. The multiplier 42 comprises two emitter-coupled pairs Q23/Q24 and Q25/Q26, respectively. Diodes D5 and D6 are connected to the respective bases of the emitter coupled pairs in the same fashion as described with respect to the multipliers of FIG. 2. Control current $I_C$ controls the amplitude of the phase-shifted output of amplifier 40 in accordance with the phasor diagram shown in FIG. 3. A plurality of common-base connected pairs Q27/Q28, Q29/Q30 and Q31/Q32 are connected to the respective outputs of amplifiers 32, 34 and 40 to compensate for load capacitance in the amplifiers and thus maintain high frequency gain in the circuit. This ensures that bandwidth remains high. The common base network couples the current outputs of the respective amplifiers to summing nodes connected to collector load resistors R5, R2, R3 and R4. The output of common base pair Q31/Q32 is coupled to isolation transistors Q19 and Q20 which serve to isolate the load resistors R5, R2, R3 and R4 from the multiplier 42.

It will be appreciated that the outputs from the summing networks in FIGS. 1 and 3 will be sinusoidal waves which are shifted in phase in accordance with the choices of the control currents by the user. When these sine waves are applied to conventional pulse generators, the pulse generators will be operating on the steepest portion of the slope of the sine wave, and thus the jitter problem mentioned previously will be minimized.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A clock-delay circuit for a sinusoidal clock output wave comprising:

(a) a first amplifier means responsive to said output wave for producing a first amplified signal in phase with said output wave;
    (b) a second amplifier means responsive to said output wave for producing a second amplified signal shifted in phase with respect to said output wave;
    (c) multiplier means responsive to said second amplified signal for altering the amplitude thereof in response to a control signal;
    (d) summing means for combining the respective outputs of said multiplier means and said first amplifier means to produce a delayed output wave; and
    (e) third amplifier means responsive to said output wave for producing a third amplified signal shifted 180 degrees in phase with respect to said output wave, and a second summing means for combining said third amplified signal and the output of said multiplier means to produce a phase-altered output wave.

2. The clock-delay circuit of claim 1, further including first and second sample and hold circuits connected to a data input line, said sample and hold circuits being responsive to said delayed output wave and to said phase-altered output wave for sampling the data on the data input line at different times.

3. The clock-delay circuit of claim 1 wherein said first amplifier means includes a deferentially driven transistor pair having both emitters coupled to opposite ends of a common resistor.

4. The clock-delay circuit of claim 3 wherein said second amplifier means includes a differentially driven transistor pair having both emitters coupled to opposite plates of a common capacitor whereby said second amplified signal is shifted in phase by 90°.

5. The clock-delay circuit of claim 1 wherein said summing means includes common base transistor pairs connected to the outputs of each of said first and third amplifier means and to said multiplier means, respectively, said transistor pairs connected to said first and third amplifier means including load resistors in their respective collector circuits for developing voltages to be summed with the output of said multiplier means.

6. The clock-delay circuit of claim 5, further including a pair of isolation transistor means connected between said multiplier means and said load resistors for coupling the outputs of said multiplier means to said load resistors.

* * * * *